(12) United States Patent
Poirier et al.

(10) Patent No.: US 10,075,150 B2
(45) Date of Patent: Sep. 11, 2018

(54) SET-RESET LATCHES

(71) Applicant: HEWLETT PACKARD ENTERPRISE DEVELOPMENT LP, Houston, TX (US)

(72) Inventors: Christopher Allan Poirier, Fort Collins, CO (US); Ryan Barnhill, Fort Collins, CO (US); Dacheng Zhou, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 100 days.

(21) Appl. No.: 15/227,326

(22) Filed: Aug. 3, 2016

(65) Prior Publication Data

US 2018/0041199 A1    Feb. 8, 2018

(51) Int. Cl.
*H03K 3/356* (2006.01)

(52) U.S. Cl.
CPC .............................. *H03K 3/356121* (2013.01)

(58) Field of Classification Search
CPC .. H03K 3/353; H03K 3/356; H03K 3/356104; H03K 3/356113; H03K 3/356121
USPC ................. 327/185, 199–203, 208, 210–212
See application file for complete search history.

(56) References Cited

U.S. PATENT DOCUMENTS

| 8,058,901 B2 * | 11/2011 | Zhang | H03K 3/356121 326/46 |
| 9,628,055 B1 * | 4/2017 | Lovitt | H03K 3/356104 |

OTHER PUBLICATIONS

Knepper, R.W., "Sequential CMOS and NMOS Logic Circuits," (Research Paper), From Chapter 8 in Kang and Leblebici, and portions of Chapter 5 in West and Eshraghian, Nov. 6, 2000, 41 pages.

* cited by examiner

*Primary Examiner* — Lincoln Donovan
*Assistant Examiner* — Diana J Cheng
(74) *Attorney, Agent, or Firm* — Hewlett Packard Enterprise Patent Department

(57) ABSTRACT

Examples disclosed herein relate to set-reset (SR) latch circuits and methods for manufacturing the same. In some of the disclosed examples, a SR latch circuit includes an inverter storage loop for storing state information and a set of p-channel field-effect transistors (PFETs) for control circuitry. The PFETs may include first and second PFETs connected to a first node of the inverter storage loop, and third and fourth PFETs connected to a second node of the inverter storage loop. Gate terminals of the first and fourth PFETs may be connected to a first control input, and gate terminals of the second and third PFETs may be connected to a second control input.

20 Claims, 8 Drawing Sheets

SET-RESET LATCHES

BACKGROUND

A latch (or flip-flop) is an electronic circuit that can store state information. The state information stored by the latch can be changed by control signals provided via control inputs.

BRIEF DESCRIPTION OF THE DRAWINGS

The following detailed description references the drawings, wherein.

DETAILED DESCRIPTION

Figure 2:
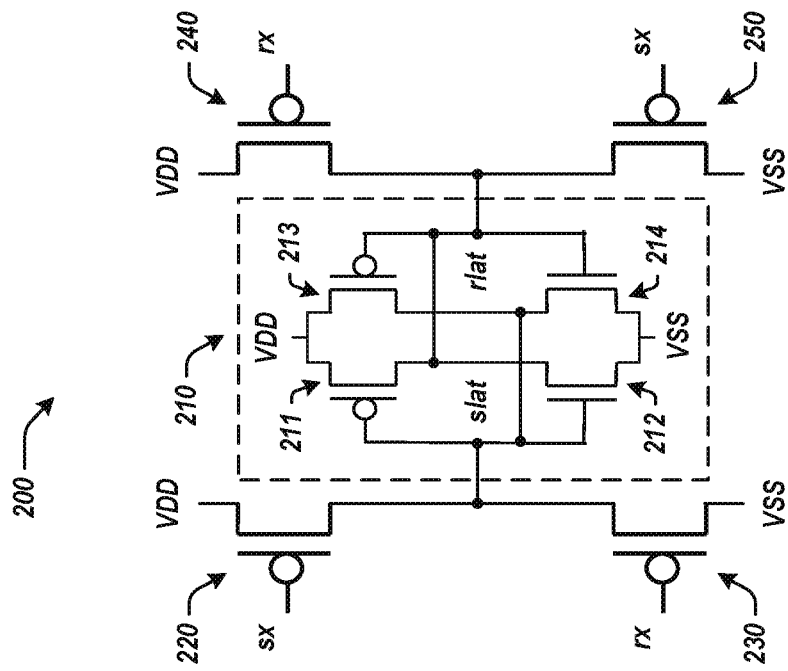
FIG. 2 is a block diagram of an example SR latch circuit.

The following detailed description refers to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

The terminology used herein is for the purpose of describing particular examples only and is not intended to be limiting. As used herein, the singular forms "a," "an," and "the" are intended to include the plural forms as well, unless the context clearly indicates otherwise. The term "plurality," as used herein, is defined as two or more than two. The term "another," as used herein, is defined as at least a second or more. The term "coupled," as used herein, is defined as connected, whether directly without any intervening elements or indirectly with at least one intervening elements, unless otherwise indicated. Two elements can be coupled mechanically, electrically, or communicatively linked through a communication channel, pathway, network, or system. The term "and/or" as used herein refers to and encompasses any and all possible combinations of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

Due to the nature of logic gates, the output of a latch may not change instantaneously in response to changes in control input signals. As a result, the input-to-output propagation of a latch signal may incur a propagation delay as it passes through each logic gate. As an example, the input-to-output propagation of a set-reset (SR) NAND latch signal may incur two propagation delays, one delay for each cross-coupled NAND gate.

Examples disclosed herein provide SR latch circuits and methods for manufacturing the same. The disclosed SR latch circuits and manufacturing methods may, among other things, reduce input-to-output propagation delays in SR latches.

In some of the disclosed examples, a SR latch circuit includes an inverter storage loop for storing state information and a set of PFETs for control circuitry. The PFETs may include first and second PFETs connected to a first node of the inverter storage loop, and third and fourth PFETs connected to a second node of the inverter storage loop. Gate terminals of the first and fourth PFETs may be connected to a first control input, and gate terminals of the second and third PFETs may be connected to a second control input.

In some of the disclosed examples, a SR latch circuit includes an inverter storage loop for storing state information and a set of n-channel field-effect transistors (NFETs) for control circuitry. The NFETs may include first and second NFETs connected to a first node of the inverter storage loop, and third and fourth NFETs connected to a second node of the inverter storage loop. Gate terminals of the first and fourth NFETs may be connected to a first control input, and gate terminals of the second and third NFETs may be connected to a second control input.

Figure 1:
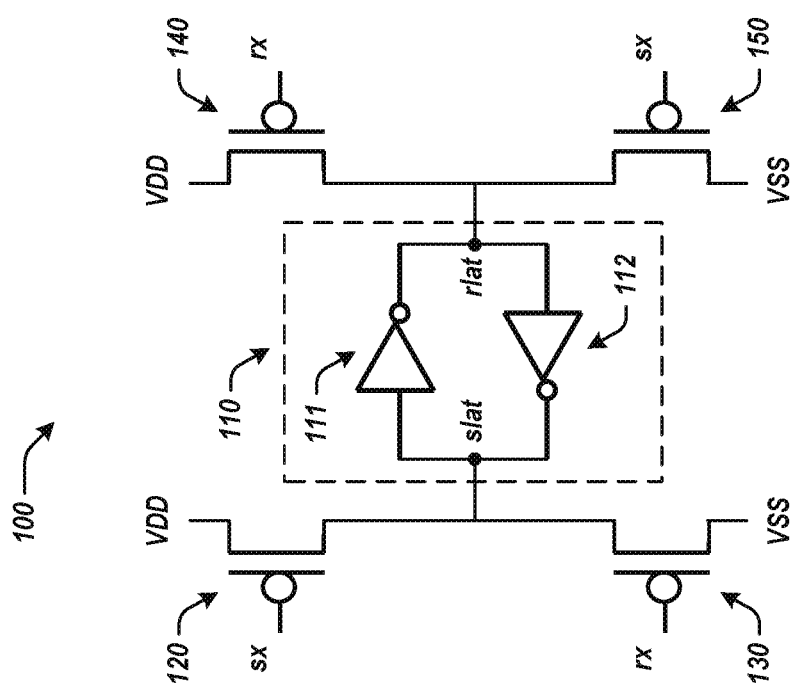
FIG. 1 is a block diagram of an example SR latch circuit.

FIG. 1 is a block diagram of an example SR latch 100 circuit. As shown in FIG. 1, SR latch 100 circuit may include an inverter storage loop 110 and a plurality of PFETs 120-150. The number and arrangement of these components is an example only and provided for purposes of illustration. Other arrangements and numbers of components may be utilized without departing from the examples of the present disclosure.

As shown in FIG. 1, inverter storage loop 110 may include a pair of cross-coupled inverters, inverter 111 and inverter 112. In some examples, inverter 111 and inverter 112 may be complementary metal-oxide semiconductor (CMOS) inverters in that inverter 111 and inverter 112 may each include a PFET and an NFET. Inverter storage loop 110 may store state information for SR latch 100 circuit.

PFETs 120-150 may be connected to inverter storage loop 110. PFETs 120-150 may be control circuitry that may be used to control the state information stored by inverter storage loop 110. PFETs 120-150 may be p-channel metal-oxide semiconductor FETs (pMOSFETs), p-channel junction FETs (pJFETs), another type of p-channel field-effect transistor, or a combination thereof.

PFET 120 and PFET 130 may be connected to a first node of inverter storage loop 110, slat (or Set Latch). The source terminal of PFET 120 may be connected to a voltage source, $V_{DD}$, whereas the drain terminal of PFET 120 may be connected to the first node of inverter storage loop 110, slat. When a conductive channel is formed between the source terminal and drain terminal of PFET 120, the output of inverter storage loop 110 at first node slat may be pulled up to $V_{DD}$.

The drain terminal of PFET 130 may be connected to a voltage drain, $V_{SS}$, whereas the source terminal of PFET 130 may be connected to the first node of inverter storage loop 110, slat. When a conductive channel is formed between the source terminal and drain terminal of PFET 130, the output of inverter storage loop 110 at first node slat may be pulled down to $V_{SS}$.

PFET 140 and PFET 150 may be connected to a second node of inverter storage loop 110, rlat (or Reset Latch). The source terminal of PFET 140 may be connected to a voltage source, $V_{DD}$, whereas the drain terminal of PFET 140 may be connected to the second node of inverter storage loop 110, rlat. When a conductive channel is formed between the source terminal and drain terminal of PFET 140, the output of inverter storage loop 110 at second node rlat may be pulled up to $V_{DD}$.

The drain terminal of PFET 150 may be connected to a voltage drain, $V_{SS}$, whereas the source terminal of PFET 150 may be connected to the second node of inverter storage loop 110, rlat. When a conductive channel is formed between the source terminal and drain terminal of PFET 150, the output of inverter storage loop 110 at second node rlat may be pulled down to $V_{SS}$.

The gate terminals of PFETs 120-150 may be connected to control inputs. The control inputs may be used to control PFETs 120-150 (i.e., by turning PFETs 120-150 on and off) to change the state information stored by inverter storage loop 110. As shown in FIG. 1, the gate terminals of PFET 120 and PFET 150 may be connected to a first control input, sx (or Set), whereas the gate terminals of PFET 130 and PFET 140 may be connected to a second control input, rx (or Reset). The gate terminals of PFETs 120-150 may be active-low inputs in that when control inputs sx and rx are asserted low (i.e., logic 0) on the gate terminals to which control inputs sx and rx are connected, a conducting channel is formed between the associated source and drain terminals. Conversely, when control inputs sx and rx are asserted high (i.e., logic 1), a conducting channel is not formed between the associated source and drain terminals.

In SR latch 100 circuit operation, when the sx control inputs are asserted low (logic 0) and the rx control inputs are asserted high (logic 1), conductive channels are formed between the source and drain terminals of PFET 120 and PFET 150 whereas no conductive channels are formed between the source and drain terminals of PFET 130 and PFET 140. PFET 120 and PFET 150 are therefore turned on and conducting whereas PFET 130 and PFET 140 are turned off and not conducting. PFET 120 pulls the output of inverter storage loop 110 at first node slat up to $V_{DD}$ (logic 1). PFET 150 pulls the output of inverter storage loop 110 at second node rlat down to $V_{SS}$ (logic 0).

In some implementations, a minimum threshold voltage ($V_{TP}$) may be used to form the conductive channel between the source and drain terminals of PFET 150. PFET 150 may therefore initially pull the output of inverter storage loop 110 at second node rlat down to $V_{SS}+V_{TP}$. However, inverter 112 may invert the $V_{SS}+V_{TP}$ output at second node rlat to $V_{DD}$ at slat and inverter 111 may invert the $V_{DD}$ at slat to $V_{SS}$ at rlat. Accordingly, the cross-coupled nature of inverter storage loop 110 may rectify the initial $V_{SS}+V_{TP}$ output at second node rat to $V_{SS}$.

When the sx control inputs are asserted high (logic 1) and the rx control inputs are asserted low (logic 0), conductive channels are formed between the source and drain terminals of PFET 130 and PFET 140 whereas no conductive channels are formed between the source and drain terminals of PFET 120 and PFET 150. PFET 130 and PFET 140 are therefore turned on and conducting whereas PFET 120 and PFET 150 are turned off and not conducting. PFET 130 pulls the output of inverter storage loop 110 at first node slat down to $V_{SS}$ (logic 0) (initially $V_{SS}+V_{TP}$ but rectified to $V_{SS}$ by cross-coupled inverters 111 and 112). PFET 140 pulls the output of inverter storage loop 110 at second node rat up to $V_{DD}$ (logic 1).

The resulting logic table for example SR latch 100 circuit illustrated in FIG. 1. may be as follows:

| sx | rx | slat | rlat | State |
|----|----|------|------|-------|
| 0  | 0  | X    | X    | Not Allowed |
| 0  | 1  | 1    | 0    | Set |
| 1  | 0  | 0    | 1    | Reset |
| 1  | 1  | slat | rlat | Hold |

Due to the structure of SR latch 100 circuit, each state change for SR latch 100 circuit results in a single input-to-output propagation delay. For example, to change the state of SR latch 100 circuit from Set to Reset (i.e., slat/rlat from 1/0 to 0/1), a single input-to-output propagation delay is incurred by PFETs 120-150 to pull slat down to 0 and rlat up to 1. Similarly, to change the state of SR latch 100 circuit from Reset to Set (i.e., slat/rlat from 0/1 to 1/0), a single input-to-output propagation delay is incurred by PFETs 120-150 to pull slat up to 1 and rlat down to 0.

SR latch 100 circuit may be manufactured at various processing nodes. In some examples, SR latch 100 circuit may be manufactured at processing nodes 16 nm or less. At processing nodes greater than 16 nm, NFET switching may be faster than PFET switching due to the differences in electron mobility and hole mobility. Electron and hole mobility (collectively referred to as carrier mobility) may quantify the ability of a carrier (electron or hole) to move through a medium such as a metal or semiconductor. The quicker a carrier can move through the medium, the higher the carrier's mobility.

NFETs are n-channel devices that use electrons as carriers to form conductive channels between source and drain terminals. PFETs are p-channel devices that use holes as carriers to form conductive channels between source and drain terminals. At manufacturing processes greater than 16 nm, NFET switching may be as much as two times faster than PFET switching. However, as processing nodes shrink, so does the difference in mobility between electrons and holes. At 16 nm, electron mobility and hole mobility (and thus NFET and PFET switching speeds) may be at or near parity.

FIG. 2 is a block diagram of an example SR latch circuit 200. As shown in FIG. 2, SR latch circuit 200 may include an inverter storage loop 210 and a plurality of PFETs 220-250. The number and arrangement of these components is an example only and provided for purposes of illustration. Other arrangements and numbers of components may be utilized without departing from the examples of the present disclosure. SR latch circuit 200 may be similar to SR latch 100 circuit of FIG. 1, except that the detail of the cross-coupled inverters of inverter storage loop 210 is illustrated in FIG. 2.

Inverter loop 210 may include a PFET 211, a NFET 212, a PFET 213, and a NFET 214. PFET 211 and NFET 212 may form one of the two cross-coupled inverters included in inverter storage loop 210, whereas PFET 213 and NFET 214 may form the second of the two cross-coupled inverters included in inverter storage loop 210.

Figures 3, 4:
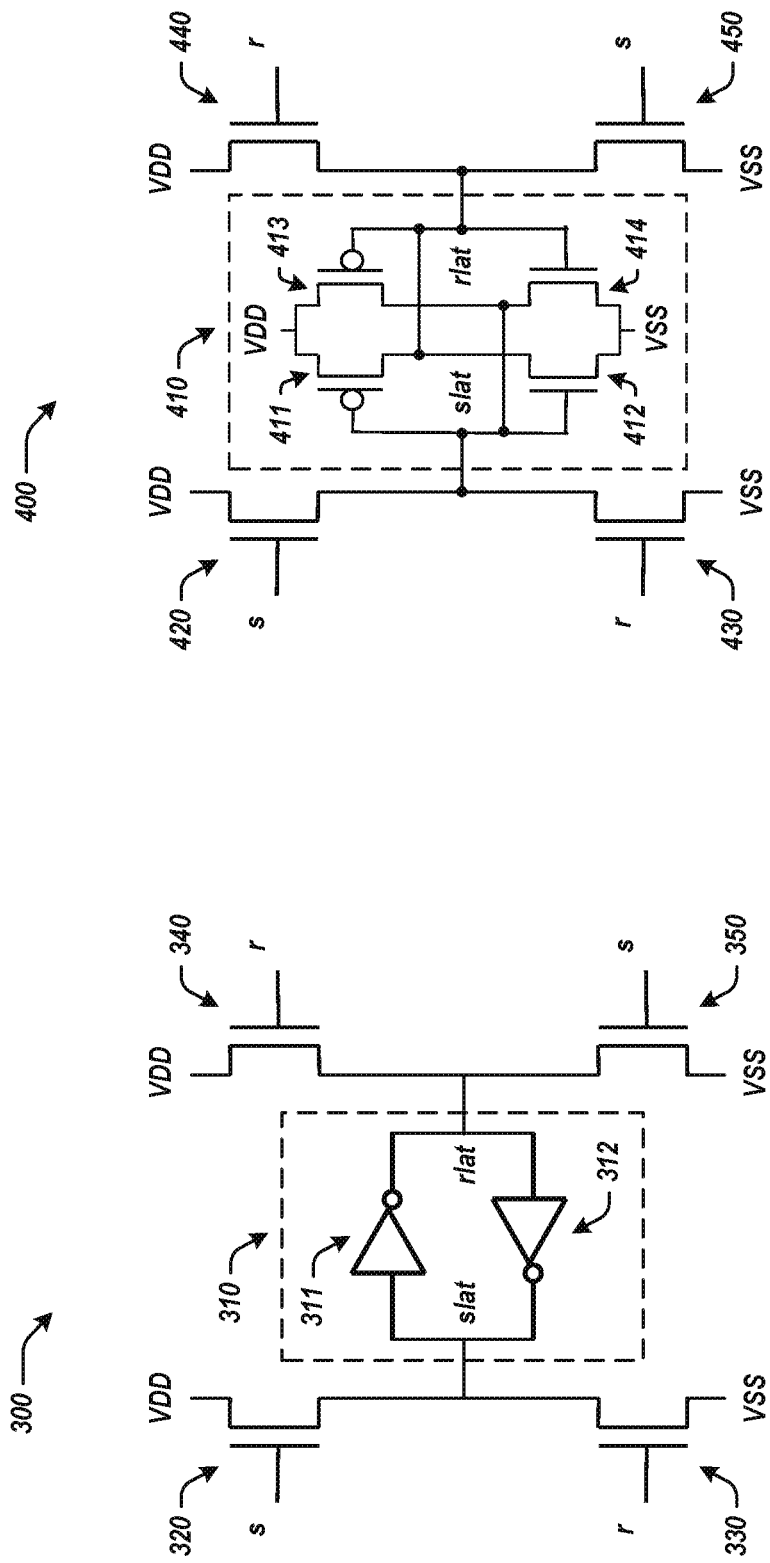
FIG. 3 is a block diagram of an example SR latch circuit.
FIG. 4 is a block diagram of an example SR latch circuit.

FIG. 3 is a block diagram of an example SR latch circuit 300. As shown in FIG. 3, SR latch circuit 300 may include an inverter storage loop 310 and a plurality of NFETs 320-350. The number and arrangement of these components is an example only and provided for purposes of illustration. Other arrangements and numbers of components may be utilized without departing from the examples of the present disclosure. SR latch circuit 300 may be manufactured at various processing nodes such as, for example, 16 nm, less than 16 nm, and greater than 16 nm.

As shown in FIG. 3, inverter storage loop 310 may include a pair of cross-coupled inverters, inverter 311 and inverter 312. In some examples, inverter 311 and inverter 312 may be CMOS inverters in that inverter 311 and inverter 312 may each include a PFET and a NFET. Inverter storage loop 310 may store state information for SR latch circuit 300.

NFETs 320-350 may be connected to inverter storage loop 310. NFETs 320-350 may be control circuitry that may be used to control the state information stored by inverter storage loop 310. NFETs 320-150 may be n-channel metal-oxide semiconductor FETs (nMOSFETs), n-channel junction FETs (nJFETs), another type of n-channel field-effect transistor, or a combination thereof.

NFET 320 and NFET 330 may be connected to a first node of inverter storage loop 310, slat (or Set Latch). The drain terminal of NFET 320 may be connected to a voltage source, $V_{DD}$, whereas the source terminal of NFET 320 may be connected to the first node of inverter storage loop 310, slat. When a conductive channel is formed between the source terminal and drain terminal of NFET 320, the output of inverter storage loop 310 at first node slat may be pulled up to $V_{DD}$.

The source terminal of NFET 330 may be connected to a voltage drain, $V_{SS}$, whereas the drain terminal of NFET 330 may be connected to the first node of inverter storage loop 310, slat. When a conductive channel is formed between the source terminal and drain terminal of NFET 330, the output of inverter storage loop 310 at first node slat may be pulled down to $V_{SS}$.

NFET 340 and NFET 350 may be connected to a second node of inverter storage loop 310, rlat (or Reset Latch). The drain terminal of NFET 340 may be connected to a voltage source, $V_{DD}$, whereas the source terminal of NFET 340 may be connected to the second node of inverter storage loop 310, rlat. When a conductive channel is formed between the source terminal and drain terminal of NFET 340, the output of inverter storage loop 310 at second node flat may be pulled up to $V_{DD}$.

The source terminal of NFET 350 may be connected to a voltage drain, $V_{SS}$, whereas the drain terminal of NFET 350 may be connected to the second node of inverter storage loop 310, rlat. When a conductive channel is formed between the source terminal and drain terminal of NFET 350, the output of inverter storage loop 310 at second node rlat may be pulled down to $V_{SS}$.

The gate terminals of NFETs 320-350 may be connected to control inputs. The control inputs may be used to control NFETs 320-350 (i.e., by turning NFETs 320-350 on and off) to change the state information stored by inverter storage loop 310. As shown in FIG. 3, the gate terminals of NFET 320 and NFET 350 may be connected to a first control input, s (or Set), whereas the gate terminals of NFET 330 and PFET 340 may be connected to a second control input, r (or Reset). The gate terminals of NFETs 320-350 may be active-high inputs in that when control inputs s and rare asserted high (i.e., logic 1) on the gate terminals to which control inputs s and r are connected, a conducting channel is formed between the associated source and drain terminals. Conversely, when control inputs s and r are asserted low (i.e., logic 0), a conducting channel is not formed between the associated source and drain terminals.

In SR latch circuit 300 operation, when the s control inputs are asserted high (logic 1) and the r control inputs are asserted low (logic 0), conductive channels are formed between the source and drain terminals of NFET 320 and NFET 350 whereas no conductive channels are formed between the source and drain terminals of NFET 330 and NFET 340. NFET 320 and NFET 350 are therefore turned on and conducting whereas NFET 330 and NFET 340 are turned off and not conducting. NFET 320 pulls the output of inverter storage loop 310 at first node slat up to $V_{DD}$ (logic 1). NFET 350 pulls the output of inverter storage loop 310 at second node rlat down to $V_{SS}$ (logic 0).

In some implementations, a minimum threshold voltage ($V_{TN}$) may be used to form the conductive channel between the source and drain terminals of NFETs 320-350. NFET 350 may therefore initially pull the output of inverter storage loop 310 at second node rlat down to $V_{SS}+V_{TN}$. However, inverter 312 may invert the $V_{SS}+V_{TN}$ output at second node rlat to $V_{DD}$ at slat and inverter 311 may invert the $V_{DD}$ at slat to $V_{SS}$ at rlat. Accordingly, the cross-coupled nature of inverter storage loop 310 may rectify the initial $V_{SS}+V_{TN}$ output at second node rlat to $V_{SS}$.

When the s control inputs are asserted low (logic 0) and the r control inputs are asserted high (logic 1), conductive channels are formed between the source and drain terminals of NFET 330 and NFET 340 whereas no conductive channels are formed between the source and drain terminals of NFET 320 and NFET 350. NFET 330 and NFET 340 are therefore turned on and conducting whereas NFET 320 and NFET 350 are turned off and not conducting. NFET 330 pulls the output of inverter storage loop 310 at first node slat down to $V_{SS}$ (logic 0) (initially $V_{SS}+V_{TN}$ but rectified to $V_{SS}$ by cross-coupled inverters 311 and 312). NFET 340 pulls the output of inverter storage loop 310 at second node rlat up to $V_{DD}$ (logic 1).

The resulting logic table for example SR latch circuit 300 illustrated in FIG. 3. may be as follows:

| s | r | slat | rlat | State |
|---|---|------|------|-------|
| 0 | 0 | slat | rlat | Hold |
| 0 | 1 | 0 | 1 | Reset |
| 1 | 0 | 1 | 0 | Set |
| 1 | 1 | X | X | Not Allowed |

Due to the structure of SR latch circuit 300, each state change for SR latch circuit 300 results in a single input-to-output propagation delay. For example, to change the state of SR latch circuit 300 from Set to Reset (i.e., slat/rlat from 1/0 to 0/1), a single input-to-output propagation delay is incurred by NFETs 320-350 to pull slat down to 0 and rlat up to 1. Similarly, to change the state of SR latch circuit 300 from Reset to Set (i.e., slat/rlat from 0/1 to 1/0), a single input-to-output propagation delay is incurred by NFETs 320-350 to pull slat up to 1 and rlat down to 0.

FIG. 4 is a block diagram of an example SR latch circuit 400. As shown in FIG. 4, SR latch circuit 400 may include an inverter storage loop 410 and a plurality of NFETs 420-450. The number and arrangement of these components is an example only and provided for purposes of illustration. Other arrangements and numbers of components may be utilized without departing from the examples of the present disclosure. SR latch circuit 400 may be similar to SR latch circuit 300 of FIG. 3, except that the detail of the cross-coupled inverters of inverter storage loop 410 is illustrated in FIG. 4.

Inverter loop 410 may include a PFET 411, a NFET 412, a PFET 413, and a NFET 414. PFET 411 and NFET 412 may form one of the two cross-coupled inverters included in inverter storage loop 410, whereas PFET 413 and NFET 414 may form the second of the two cross-coupled inverters included in inverter storage loop 410.

Figure 5:
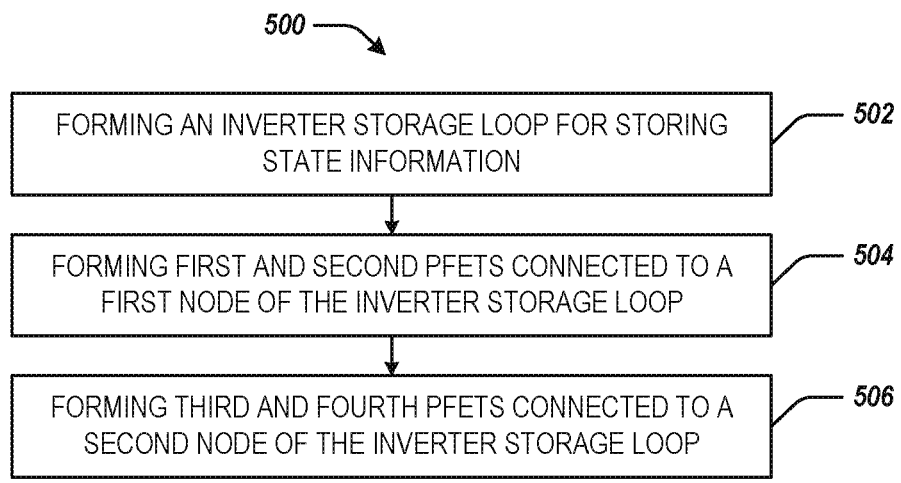
FIG. 5 is a flowchart of an example method for manufacturing a SR latch circuit.

FIG. 5 is a flowchart depicting an example method 500 for manufacturing a SR latch circuit. Method 500 may, for example, be used to manufacture SR latch circuit 100 circuit of FIG. 1 and SR latch circuit 200 of FIG. 2. In some examples, steps of method 500 may be executed substantially concurrently or in a different order than shown in FIG. 5. In some examples, method 500 may include more or less steps than are shown in FIG. 5. In some examples, some of the steps of method 500 may be ongoing or repeat.

At block 502, method 500 may include forming an inverter storage loop for storing state information, such as inverter storage loop 110 of FIG. 1 and inverter storage loop 210 of FIG. 2.

At block 504, method 500 may include forming first and second PFETs connected to a first node of the inverter storage loop, such as PFET 120 and PFET 130 of FIG. 1, and PFET 220 and PFET 230 of FIG. 2.

At block 506, method 500 may include forming third and fourth PFETs connected to a second node of the inverter storage loop, such as PFET 140 and PFET 150 of FIG. 1, and PFET 240 and PFET 250 of FIG. 2.

Figure 6:
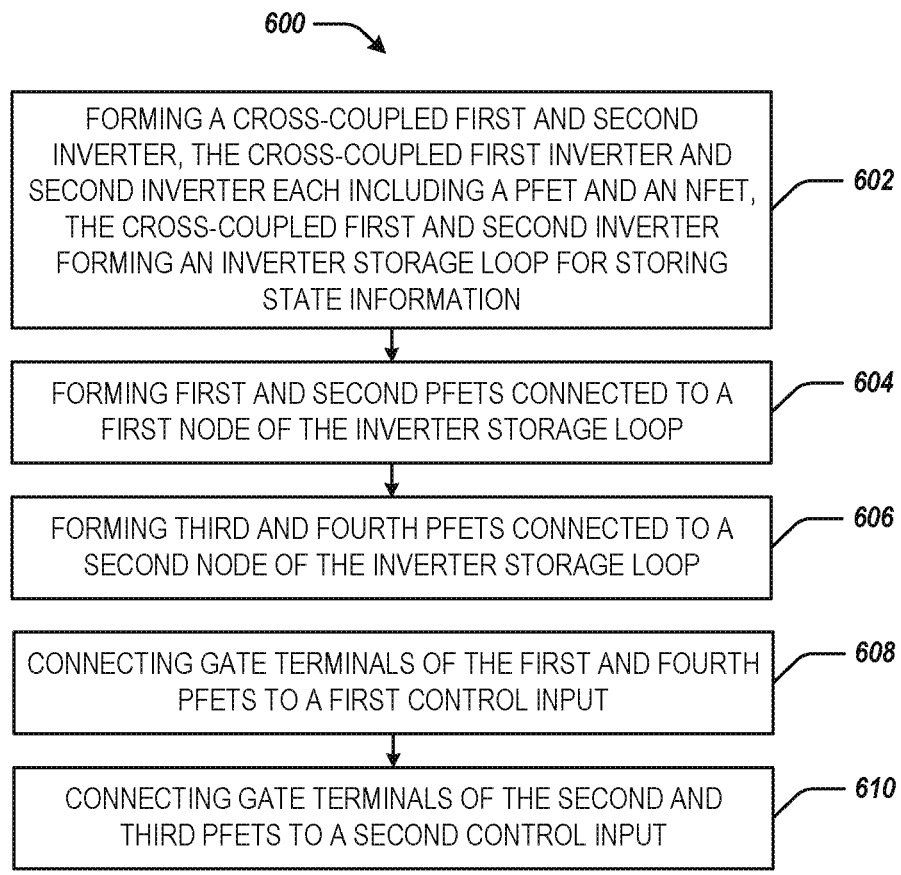
FIG. 6 is a flowchart of an example method for manufacturing a SR latch circuit.

FIG. 6 is a flowchart depicting an example method 600 for manufacturing a SR latch circuit. Method 600 may, for example, be used to manufacture SR latch 100 circuit of FIG. 1 and SR latch circuit 200 of FIG. 2. In some examples, steps of method 600 may be executed substantially concurrently or in a different order than shown in FIG. 6. In some examples, method 600 may include more or less steps than are shown in FIG. 6. In some examples, some of the steps of method 600 may be ongoing or repeat.

At block 602, method 600 may include forming a cross-coupled first inverter and second inverter, such as inverter 111 of FIG. 1 and inverter 112 of FIG. 1. The cross-coupled first inverter and second inverter may each include a PFET and an NFET, such as PFET 211 and NFET 212, and PFET 213 and NFET 214 of FIG. 2. The cross-coupled first inverter and second inverter may form an inverter storage loop for storing state information, such as inverter storage loop 110 of FIG. 1, and inverter storage loop 210 of FIG. 2.

At block 604, method 600 may include forming first and second PFETs connected to a first node of the inverter storage loop, such as PFET 120 and PFET 130 of FIG. 1, and PFET 220 and PFET 230 of FIG. 2.

At block 606, method 600 may include forming third and fourth PFETs connected to a second node of the inverter storage loop, such as PFET 140 and PFET 150 of FIG. 1, and PFET 240 and PFET 250 of FIG. 2.

At block 608, method 600 may include connecting gate terminals of the first and fourth PFETs to a first control input, such as sx of FIG. 1 and FIG. 2.

At block 610, method 600 may include connecting gate terminals of the second and third PFETs to a second control input, such as rx of FIG. 1 and FIG. 2.

Figure 7:
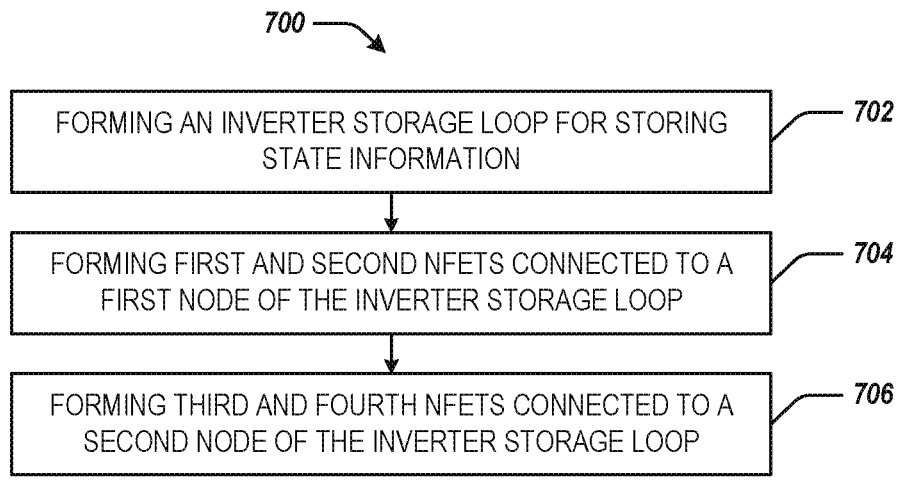
FIG. 7 is a flowchart of an example method for manufacturing a SR latch circuit.

FIG. 7 is a flowchart depicting an example method 700 for manufacturing a SR latch circuit. Method 700 may be used, for example, to manufacture SR latch circuit 300 of FIG. 3 and SR circuit latch 400 of FIG. 4. In some examples, steps of method 700 may be executed substantially concurrently or in a different order than shown in FIG. 7. In some examples, method 700 may include more or less steps than are shown in FIG. 7. In some examples, some of the steps of method 700 may be ongoing or repeat.

At block 702, method 700 may include forming an inverter storage loop for storing state information, such as inverter storage loop 310 of FIG. 3 and inverter storage loop 410 of FIG. 4.

At block 704, method 700 may include forming first and second NFETs connected to a first node of the inverter storage loop, such as NFET 320 and NFET 330 of FIG. 3, and NFET 420 and NFET 430 of FIG. 4.

At block 706, method 700 may include forming third and fourth NFETs connected to a second node of the inverter storage loop, such as NFET 340 and NFET 350 of FIG. 3, and NFET 440 and NFET 450 of FIG. 4.

Figure 8:
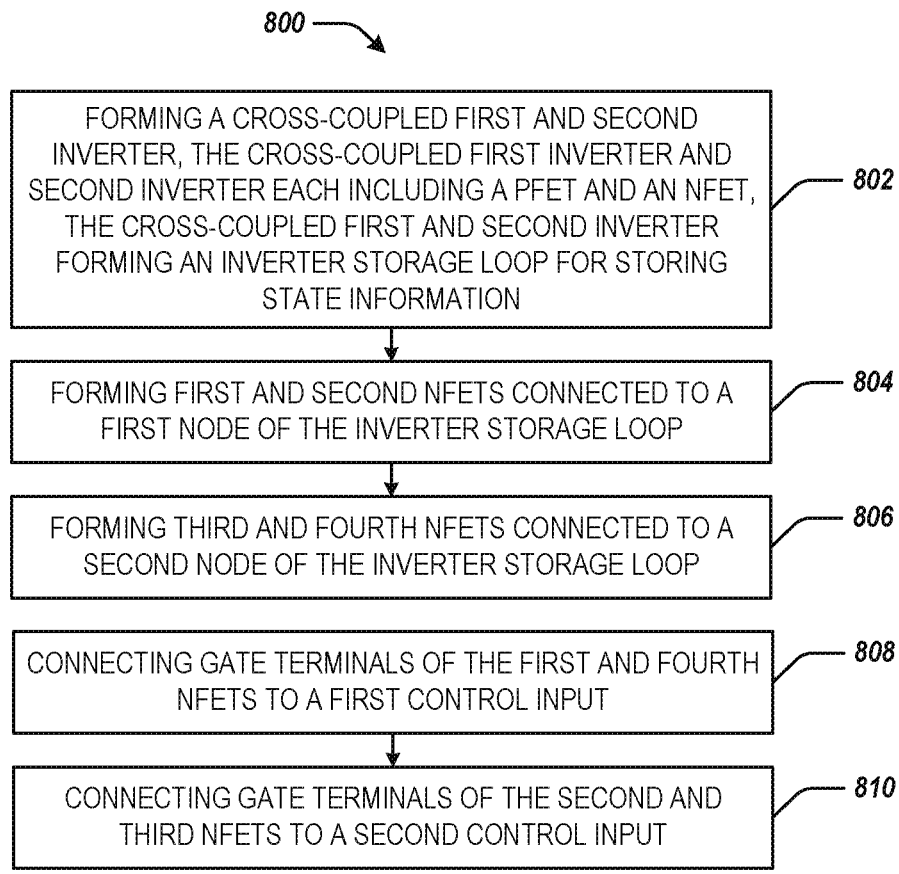
FIG. 8 is a flowchart of an example method for manufacturing a SR latch circuit.

FIG. 8 is a flowchart depicting an example method 800 for manufacturing a SR latch circuit. Method 800 may, for example, be used to manufacture SR latch circuit 300 of FIG. 3 and SR latch circuit 400 of FIG. 4. In some examples, steps of method 800 may be executed substantially concurrently or in a different order than shown in FIG. 8. In some examples, method 800 may include more or less steps than are shown in FIG. 8. In some examples, some of the steps of method 800 may be ongoing or repeat.

At block 802, method 800 may include forming a cross-coupled first inverter and second inverter, such as inverter 311 of FIG. 3 and inverter 312 of FIG. 3. The cross-coupled first inverter and second inverter may each include a PFET and an NFET, such as PFET 411 and NFET 412, and PFET 413 and NFET 414 of FIG. 4. The cross-coupled first inverter and second inverter may form an inverter storage loop for storing state information, such as inverter storage loop 310 of FIG. 3 and inverter storage loop 410 of FIG. 4.

At block 804, method 800 may include forming first and second NFETs connected to a first node of the inverter storage loop, such as NFET 320 and NFET 330 of FIG. 3, and NFET 420 and NFET 430 of FIG. 4.

At block 806, method 800 may include forming third and fourth NFETs connected to a second node of the inverter storage loop, such as NFET 340 and NFET 350 of FIG. 3, and NFET 440 and NFET 450 of FIG. 4.

At block 808, method 800 may include connecting gate terminals of the first and fourth NFETs to a first control input, such as s of FIG. 3 and FIG. 4.

At block 810, method 800 may include connecting gate terminals of the second and third NPFETs to a second control input, such as r of FIG. 3 and FIG. 4.

Figure 9:
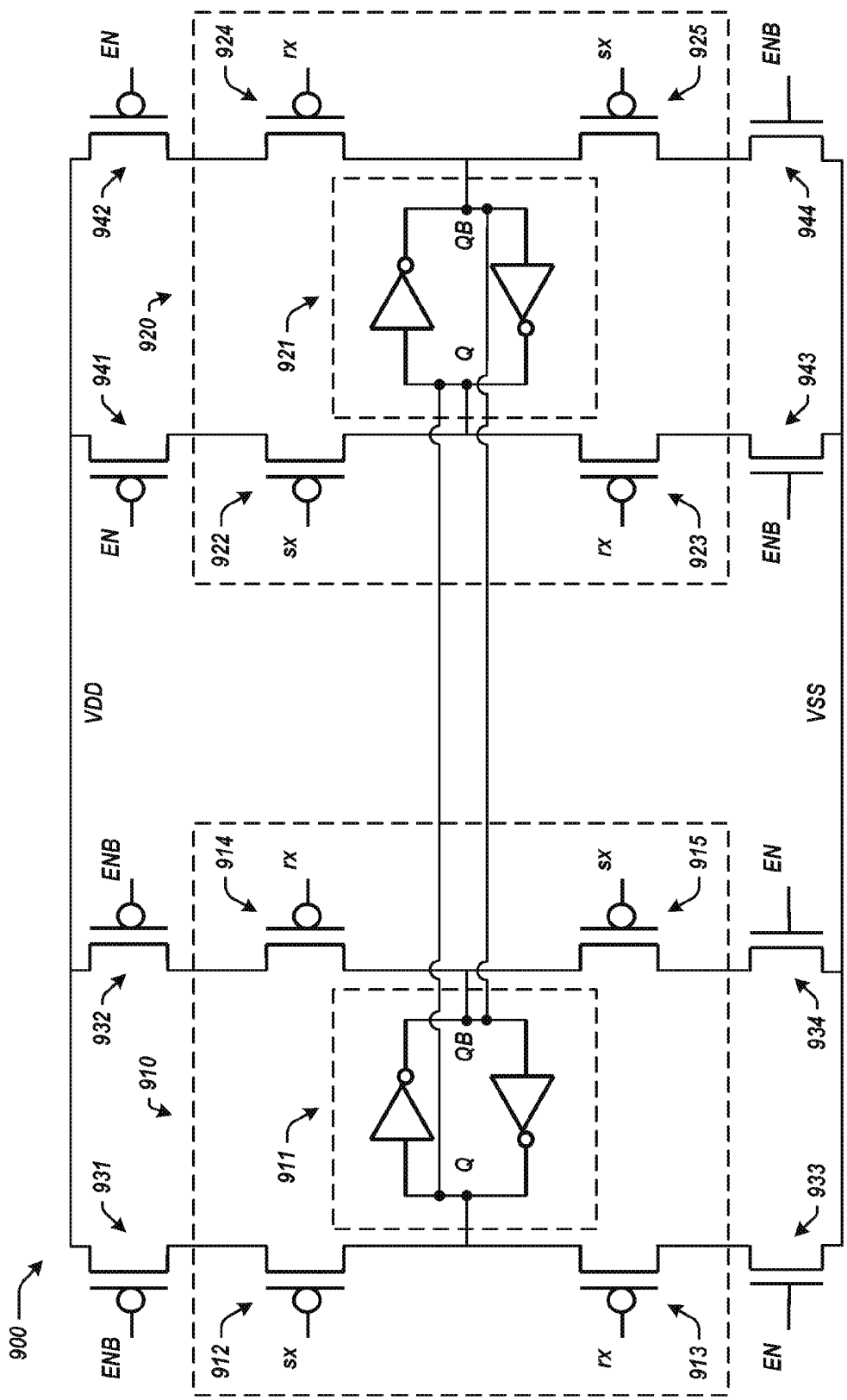
FIG. 9 is a block diagram of an example SR latch multiplexer (MUX) circuit.

The example SR latch circuits described in FIGS. 1-4, and the SR latch circuits manufactured according to the methods illustrated in FIGS. 5-8, may be used to form various circuits and other structures. FIG. 9 illustrates an example SR latch multiplexer (MUX) circuit 900 that includes a plurality of SR latch circuits (i.e., SR latch circuit 910 and SR latch circuit 920) that may be implemented by SR latch circuit 100 illustrated in FIG. 1. SR latch MUX circuit 900 may also include a plurality of FETs, including PFET 931, 932, 941, and 942; and NFET 933, 934, 943, and 944. The number and arrangement of these components is an example only and provided for purposes of illustration. Other arrangements and numbers of components may be utilized without departing from the examples of the present disclosure. For example, SR latch circuits 910 and 920 may be implemented by SR latch circuit 200 of FIG. 2, SR latch circuit 300 of FIG. 3, SR latch circuit 400 of FIG. 4, or a combination thereof.

As shown in FIG. 9, the source terminals of PFET 931, 932, 941, and 942 may be connected to $V_{DD}$; and the source terminals of NFET 933, 934, 943, and 944 may be connected to $V_{SS}$. The drain terminals of PFET 931, 932, 941, and 942 may be connected to the source terminals of PFET 912, 914, 922, and 924 respectively. The drain terminals of NFET 933, 934, 943, and 944 may be connected to the drain terminals of PFET 913, 915, 923, and 925 respectively. The gate terminals of NFET 933 and 934 and PFET 941 and 942 may be connected to the Enable (EN) input of SR latch MUX circuit 900. The gate terminals of PFET 931 and 932 and NFET 943 and 944 may be connected to the Enable B (ENB) input of SR latch MUX circuit 900. First nodes Q of inverter storage loops 911 and 921 may be connected to each other and second nodes QB inverter storage loops 911 and 921 may be connected to each other.

In operation, PFET 931, 932, 941, and 942; and NFET 933, 934, 943, and 944 act as qualifiers for SR latch circuit 910 and 920's operation. For example, when ENB is asserted low and EN is asserted high, PFET 931 and 932 and NFET 933 and 934 are activated, thereby allowing SR latch circuit 910 to operate as described above in reference to FIGS. 1-4. In contrast, NFET 941 and 942 and PFET 943 and 944 are deactivated, thereby deactivating SR latch circuit 920. As another example, when ENB is asserted high and EN is asserted low, PFET 931 and 932 and NFET 933 and 934 are deactivated, thereby deactivating SR latch circuit 910. In contrast, NFET 941 and 942 and PFET 943 and 944 are activated, thereby allowing SR latch circuit 920 to operate as described above in reference to FIGS. 1-4.

Figure 10:
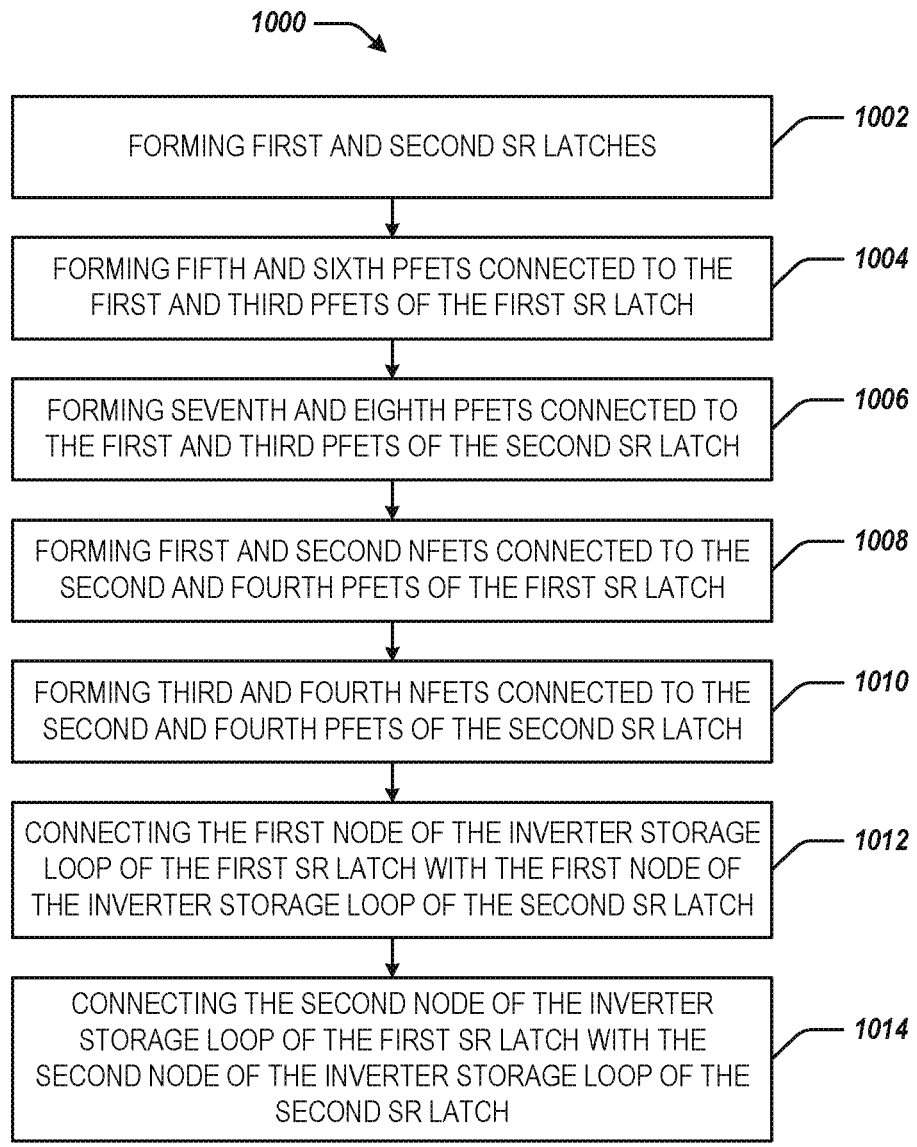
FIG. 10 is a flowchart of an example method for manufacturing a SR latch MUX circuit.

FIG. 10 is a flowchart depicting an example method 1000 for manufacturing a SR latch MUX circuit. Method 1000 may, for example, be used to manufacture SR latch MUX circuit 900 of FIG. 9. In some examples, steps of method 1000 may be executed substantially concurrently or in a different order than shown in FIG. 10. In some examples, method 1000 may include more or less steps than are shown in FIG. 10. In some examples, some of the steps of method 1000 may be ongoing or repeat.

At block 1002, method 1000 may include forming first and second SR latch circuits. The first and second SR latch circuits may be any of the example SR latch circuits described in FIGS. 1-4 or the SR latch circuits manufactured according to the methods illustrated in FIGS. 5-8.

At block 1004, method 1000 may include forming fifth and sixth PFETs connected to the first and third PFETs of the first SR latch circuit, such as PFET 931 and 932 of FIG. 9. The fifth and sixth PFETs may further be connected to $V_{DD}$ and ENB inputs.

At block 1006, method 1000 may include forming seventh and eighth PFETs connected to the first and third PFETs of the second SR latch circuit, such as PFET 941 and 942 of FIG. 9. The seventh and eighth PFETs may further be connected to $V_{DD}$ and EN inputs.

At block 1008, method 1000 may include forming first and second NFETs connected to the second and fourth PFETs of the first SR latch circuit, such as PFET 933 and 934 of FIG. 9. The first and second NFETs may further be connected to $V_{SS}$ and EN inputs.

At block 1010, method 1000 may include forming third and fourth NFETs connected to the second and fourth PFETs of the second SR latch circuit, such as PFET 943 and 944 of FIG. 9. The third and fourth NFETs may further be connected to $V_{SS}$ and ENB inputs.

At block 1012, method 1000 may include connecting the first node of the inverter storage loop of the first SR latch circuit with the first node of the inverter storage loop of the second SR latch circuit.

At block 1014, method 1000 may include connecting the second node of the inverter storage loop of the first SR latch circuit with the second node of the inverter storage loop of the second SR latch circuit.

Figure 11:
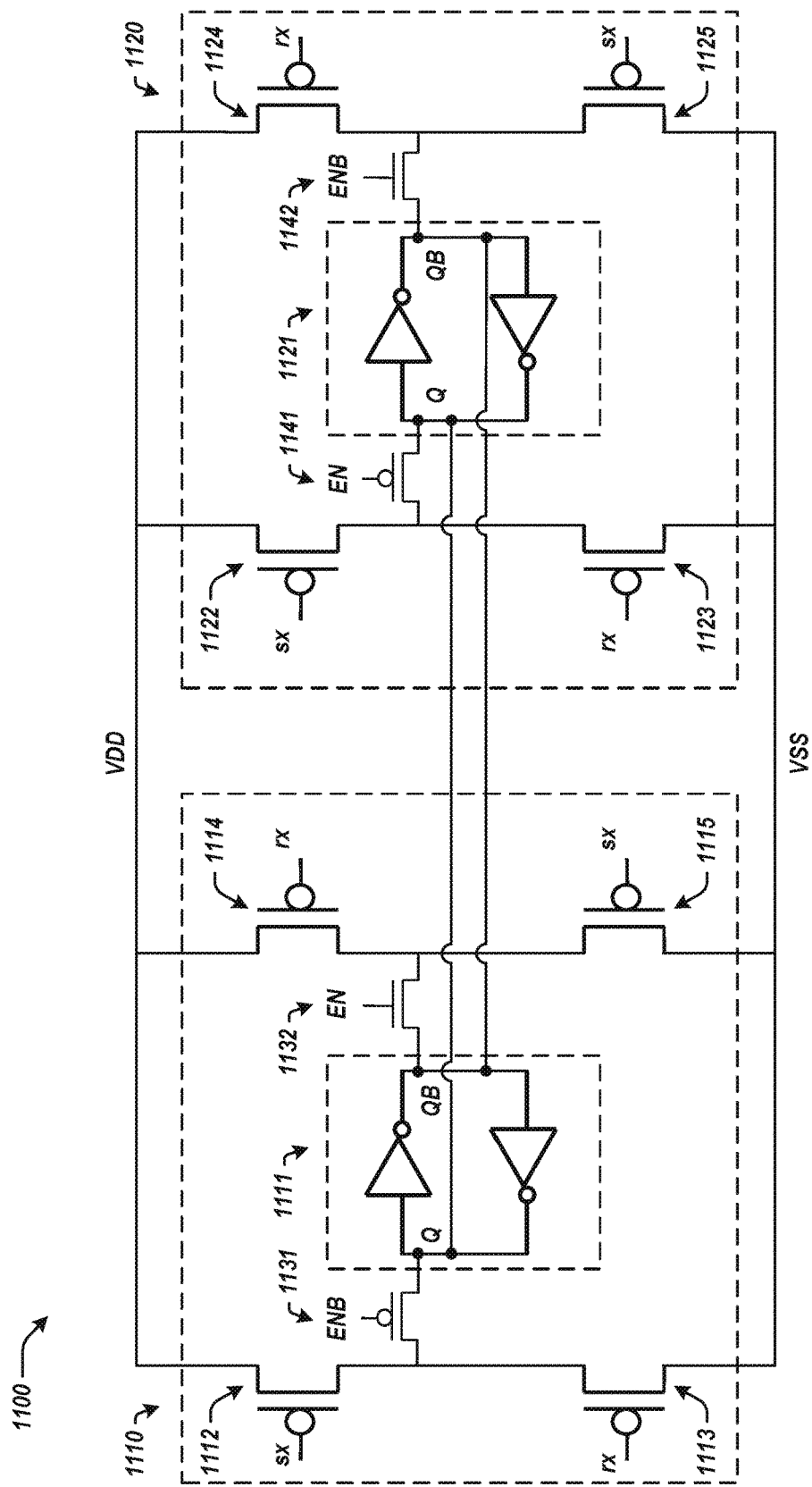
FIG. 11 is a block diagram of an example SR latch MUX circuit.

FIG. 11 illustrates an example SR latch MUX circuit 1100 that includes a plurality of SR latch circuits (i.e., SR latch circuit 1110 and SR latch circuit 1120) that may be implemented by SR latch 100 circuit illustrated in FIG. 1. SR latch MUX circuit 1100 may also include a plurality of FETs, including PFET 1131 and 1141 and NFET 1132 and 1142. The number and arrangement of these components is an example only and provided for purposes of illustration. Other arrangements and numbers of components may be utilized without departing from the examples of the present disclosure. For example, SR latch circuit 1110 and 1120 may be implemented by SR latch circuit 200 of FIG. 2, SR latch circuit 300 of FIG. 3, SR latch circuit 400 of FIG. 4, or a combination thereof. As another example, PFET 1131 and 1141 may be implemented as NFETs and NFET 1132 and 1142 may be implemented as PFETs.

As shown in FIG. 11, the source terminal of PFET 1131 may be connected to the drain terminal of PFET 1112 and the source terminal of PFET 1113, and the drain terminal of PFET 1131 may be connected to first node Q of inverter storage loop 1111. The source terminal of NFET 1132 may be connected to the drain terminal of PFET 1114 and the source terminal of PFET 1115, and the drain terminal of NFET 1132 may be connected to second node QB of inverter storage loop 1111. The gate terminal of PFET 1131 may be connected to an ENB input while the gate terminal of NFET 1132 may be connected to an EN input.

The source terminal of PFET 1141 may be connected to the drain terminal of PFET 1122 and the source terminal of PFET 1123, and the drain terminal of PFET 1141 may be connected to first node Q of inverter storage loop 1121. The source terminal of NFET 1142 may be connected to the drain terminal of PFET 1124 and the source terminal of PFET 1125, and the drain terminal of NFET 1142 may be connected to second node QB of inverter storage loop 1121. The gate terminal of PFET 1141 may be connected to an EN input while the gate terminal of NFET 1142 may be connected to an ENB input.

First nodes Q of inverter storage loops 1111 and 1121 may be connected to each other and second nodes QB inverter storage loops 1111 and 1121 may be connected to each other.

In operation, PFET 1131 and 1141 and NFET 1132 and 1142 act as qualifiers for SR latch circuit 1110 and 1120's operation. For example, when ENB is asserted low and EN is asserted high, PFET 1131 and NFET 1132 are activated, thereby allowing SR latch circuit 1110 to operate as described above in reference to FIGS. 1-4. In contrast, PFET 1141 and NFET 1142 are deactivated, thereby deactivating SR latch circuit 1120. As another example, when ENB is asserted high and EN is asserted low, PFET 1131 and NFET 1132 are deactivated, thereby deactivating SR latch circuit 1110. In contrast, PFET 1141 and NFET 1142 are activated, thereby allowing SR latch circuit 1120 to operate as described above in reference to FIGS. 1-4.

Figure 12:
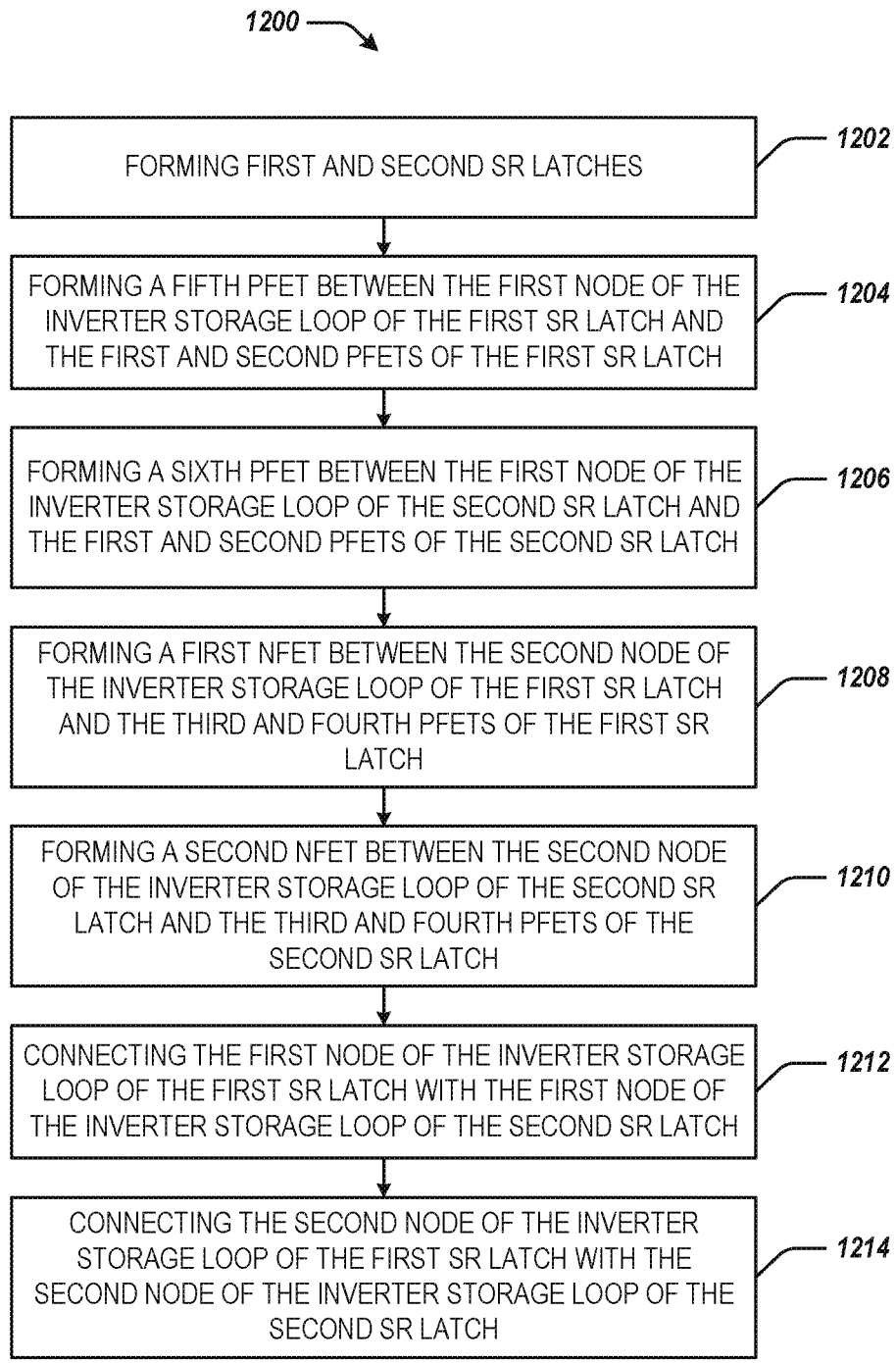
FIG. 12 is a flowchart of an example method for manufacturing a SR latch MUX circuit.

FIG. 12 is a flowchart depicting an example method 1200 for manufacturing a SR latch MUX circuit. Method 1200 may, for example, be used to manufacture SR latch MUX circuit 1100 of FIG. 11. In some examples, steps of method 1200 may be executed substantially concurrently or in a different order than shown in FIG. 12. In some examples, method 1200 may include more or less steps than are shown in FIG. 12. In some examples, some of the steps of method 1200 may be ongoing or repeat.

At block 1202, method 1200 may include forming first and second SR latch circuits. The first and second SR latch circuits may be any of the example SR latch circuits described in FIGS. 1-4 or the SR latch circuits manufactured according to the methods illustrated in FIGS. 5-8.

At block 1204, method 1200 may include forming a fifth PFET between the first node of the inverter storage loop of the first SR latch circuit and the first and second PFETs of the first SR latch circuit, such as PFET 1131 of FIG. 11. The fifth PFET may further be connected to an ENB input.

At block 1206, method 1200 may include forming a sixth PFET between the first node of the inverter storage loop of the second SR latch circuit and the first and second PFETs of the second SR latch circuit, such as PFET 1141 of FIG. 11. The sixth PFET may further be connected to an EN input.

At block 1208, method 1200 may include forming a first NFET between the second node of the inverter storage loop of the first SR latch circuit and the third and fourth PFETs of the first SR latch circuit, such as NFET 1132 of FIG. 11. The first NFET may further be connected to an EN input.

At block 1210, method 1200 may include forming a second NFET between the second node of the inverter storage loop of the second SR latch circuit and the third and fourth PFETs of the second SR latch circuit, such as NFET 1142 of FIG. 11. The second NFET may further be connected to an ENB input.

At block 1212, method 1200 may include connecting the first node of the inverter storage loop of the first SR latch circuit with the first node of the inverter storage loop of the second SR latch circuit.

At block 1214, method 1200 may include connecting the second node of the inverter storage loop of the first SR latch circuit with the second node of the inverter storage loop of the second SR latch circuit.

The foregoing disclosure describes a number of example implementations of SR latch circuits. The disclosed examples may include SR latch circuits and methods for manufacturing the same. For purposes of explanation, certain examples are described with reference to the components illustrated in FIGS. 1-12. The functionality of the illustrated components may overlap, however, and may be present in a fewer or greater number of elements and components. Moreover, the disclosed examples may be implemented in various environments and are not limited to the illustrated examples.

Further, the sequence of operations described in connection with FIGS. 5-8, 10, and 12 are an examples and are not intended to be limiting. Additional or fewer operations or combinations of operations may be used or may vary without departing from the scope of the disclosed examples. Furthermore, implementations consistent with the disclosed examples need not perform the sequence of operations in any particular order. Thus, the present disclosure merely sets forth possible examples of implementations, and many variations and modifications may be made to the described examples. All such modifications and variations are intended to be included within the scope of this disclosure and protected by the following claims.

The invention claimed is:

1. A circuit, comprising:
   an inverter storage loop for storing state information;
   first and second p-channel field-effect transistors (PFETs) connected to a first node of the inverter storage loop;
   a first FET connected between the first node of the inverter storage loop and the first and second PFETs, a gate terminal of the first FET being connected to an Enable B multiplexing control input;
   third and fourth PFETs connected to a second node of the inverter storage loop;
   wherein gate terminals of the first and fourth PFETs are connected to a first control input, and gate terminals of the second and third PFETs are connected to a second control input; and
   a second FET connected between the second node of the inverter storage loop and the third and fourth PFETs, a gate terminal of the second FET being connected to an Enable multiplexing control input.

2. The circuit of claim 1, wherein:
   a drain terminal of the first PFET and a source terminal of the second PFET are connected to the first node of the inverter storage loop; and
   a drain terminal of the third PFET and a source terminal of the fourth PFET are connected to the second node of the inverter storage loop.

3. The circuit of claim 2, wherein:
   a source terminal of the first PFET and a source terminal of the third PFET are connected to a voltage source; and
   a drain terminal of the second PFET and a drain terminal of the fourth PFET are connected to a voltage drain.

4. The circuit of claim 1, wherein:
   the first control input is a Set control input; and
   the second control input is a Reset control input.

5. The circuit of claim 4, wherein the Set and Reset control inputs are active low control inputs.

6. The circuit of claim 1, wherein the circuit is implemented in a 16 nm process.

7. The circuit of claim 1, wherein the inverter storage loop includes a cross-coupled first inverter and second inverter.

8. The circuit of claim 7, wherein the cross-coupled first inverter and second inverter each include a PFET and an n-channel field-effect transistor (NFET).

9. The circuit of claim 1, wherein an output at the first node is a Set latch output and an output at the second node is a Reset latch output.

10. The circuit of claim 1, wherein the inverter storage loop is a first inverter storage loop, the circuit comprising:
    a second inverter storage loop for storing state information;
    sixth and seventh PFETs connected to a first node of the second inverter storage loop, a gate terminal of the sixth PFET being connected to the first control input and a gate terminal of the seventh PFET being connected to the second control input;
    eighth and ninth PFETs connected to a second node of the second inverter storage loop, a gate terminal of the eighth PFET being connected to the second control input and a gate terminal of the ninth PFET being connected to the first control input;
    a third FET connected between the first node of the second inverter storage loop and the sixth and seventh PFETs, a gate terminal of the third FET being connected to the Enable multiplexing control input; and
    a fourth FET connected between the second node of the second inverter storage loop and the eighth and ninth PFETs, a gate terminal of the fourth FET being connected to the Enable B multiplexing control input;
    wherein the first node of the first inverter storage loop is connected to the first node of the second inverter storage loop and the second node of the first inverter storage loop is connected to the second node of the second inverter storage loop.

11. The circuit of claim 1, comprising:
a fifth PFET connected between the first PFET and a voltage source;
a sixth PFET connected between the third PFET and the voltage source;
a first n-channel field-effect transistor (NFET) connected between the second PFET and a voltage drain; and
a second NFET connected between the fourth PFET and the voltage drain;
wherein gate terminals of the fifth and sixth PFETs are connected to the Enable B multiplexer control input and gate terminals of the first and second NFETs are connected to the Enable multiplexer control input.

12. The circuit of claim 11, wherein the inverter storage loop is a first inverter storage loop, the circuit comprising:
a second inverter storage loop for storing state information;
seventh and eighth PFETs connected to a first node of the second inverter storage loop, a gate terminal of the seventh PFET being connected to the first control input and a gate terminal of the eighth PFET being connected to the second control input;
ninth and tenth PFETs connected to a second node of the second inverter storage loop, a gate terminal of the ninth PFET being connected to the second control input and a gate terminal of the tenth PFET being connected to the first control input;
an eleventh PFET connected between the seventh PFET and the voltage source;
a twelfth PFET connected between the ninth PFET and the voltage source;
a third NFET connected between the eighth PFET and the voltage drain; and
a fourth NFET connected between the tenth PFET and the voltage drain;
wherein gate terminals of the eleventh and twelfth PFETs are connected to the Enable multiplexer control input and gate terminals of the third and fourth NFETs are connected to the Enable B multiplexer control input; and
wherein the first node of the first inverter storage loop is connected to the first node of the second inverter storage loop and the second node of the first inverter storage loop is connected to the second node of the second inverter storage loop.

13. A set-reset (SR) latch, comprising:
an inverter storage loop for storing state information;
first and second n-channel field-effect transistors (NFETs) connected to a first node of the inverter storage loop;
a first FET connected between the first node of the inverter storage loop and the first and second NFETs, a gate terminal of the first FET being connected to an Enable B multiplexing control input;
third and fourth NFETs connected to a second node of the inverter storage loop,
wherein gate terminals of the first and fourth NFETs are connected to a first control input, and gate terminals of the second and third NFETs are connected to a second control input and;
a second FET connected between the second node of the inverter storage loop and the third and fourth NFETs, a gate terminal of the second FET being connected to an Enable multiplexing control input.

14. The SR latch of claim 13, wherein:
the first control input is a Set control input; and
the second control input is a Reset control input.

15. The SR latch of claim 14, wherein the Set and Reset control inputs are active high control inputs.

16. A method for manufacturing a set-reset (SR) latch, comprising:
forming an inverter storage loop for storing state information;
forming first and second p-channel field-effect transistors (PFETs) connected to a first node of the inverter storage loop; and
forming third and fourth PFETs connected to a second node of the inverter storage loop;
forming a fifth PFET connected between the first PFET and a voltage source;
forming a sixth PFET connected between the third PFET and the voltage source;
forming a first n-channel field-effect transistor (NFET) connected between the second PFET and a voltage drain; and
forming a second NFET connected between the fourth PFET and the voltage drain;
wherein gate terminals of the fifth and sixth PFETs are connected to an Enable B multiplexer control input and gate terminals of the first and second NFETs are connected to an Enable multiplexer control input.

17. The method of claim 16, wherein the inverter storage loop and the first, second, third, and fourth PFETs are formed using a 16 nm process.

18. The method of claim 17, wherein forming the inverter storage loop includes:
forming a cross-coupled first inverter and second inverter, the cross-coupled first inverter and second inverter each including a PFET and an n-channel field-effect transistor (NFET).

19. The method of claim 16, comprising:
connecting gate terminals of the first and fourth PFETs to a first control input; and
connecting gate terminals of the second and third PFETs to a second control input.

20. The method of claim 16, comprising:
forming a first FET connected between the first node of the inverter storage loop and the first and second PFETs, a gate terminal of the first FET being connected to the Enable B multiplexing control input; and
forming a second FET connected between the second node of the inverter storage loop and the third and fourth PFETs, a gate terminal of the second FET being connected to the Enable multiplexing control input.

* * * * *